(12) United States Patent
Grodd (10) Patent No.: US 6,381,731 B1
(45) Date of Patent: Apr. 30, 2002

(54) PLACEMENT BASED DESIGN CELLS INJECTION INTO AN INTEGRATED CIRCUIT DESIGN

(76) Inventor: Laurence W. Grodd, 3746 SE. Yamhill, Portland, OR (US) 97214

( * ) Notice: Subject to any disclaimer, the term of this patent is extended or adjusted under 35 U.S.C. 154(b) by 0 days.

(21) Appl. No.: 09/234,030

(22) Filed: Jan. 19, 1999

(51) Int. Cl.[7] ............................................. G06F 17/50
(52) U.S. Cl. .................................. 716/7; 716/1; 716/11
(58) Field of Search .............................. 716/7, 8, 910, 716/4, 5, 1, 2

(56) References Cited

U.S. PATENT DOCUMENTS

| | | | | |
|---|---|---|---|---|
| 5,661,663 A | * | 8/1997 | Scepanovic et al. | 364/490 |
| 5,682,322 A | * | 10/1997 | Boyle et al. | 364/491 |
| 5,754,824 A | * | 5/1998 | Damiano et al. | 395/500 |
| 6,074,430 A | * | 6/2000 | Tsukiboshi | 716/9 |
| 6,131,182 A | * | 10/2000 | Beakes et al. | 716/8 |
| 6,145,117 A | * | 11/2000 | Eng | 716/18 |

* cited by examiner

*Primary Examiner*—Matthew Smith
*Assistant Examiner*—Leigh Marie Garbowski
(74) *Attorney, Agent, or Firm*—Columbia IP Law Group, PC (57) ABSTRACT

An EDA tool is provided with the ability to re-express a design cell of an IC design in terms of placements of a number of newly formed intervening constituent design cells, the IC design having a number of hierarchically organized placements of design cells. The new intervening constituent design cells is formed in accordance with a number of metrics profiling placements of the original constituent design cells of the design cell. The EDA tool is also provided with the ability to determine the metrics. In one embodiment, the metrics are weights reflective of at least edge placement activities associated with row/column coordinates of the design cell. Th EDA tool determines these weights associated with the row/column coordinates, and then uses the determined weights to select a subset of the row/column coordinates as cut line coordinates to logically partition the design cell into a number of regions. Finally, the EDA tool selectively groups contents of the selected design cell to form the new intervening constituent design cells based on the contents' relations to the formed regions. In one embodiment, the EDA tool is a design verification tool for use to verify the IC design prior to fabrication.

26 Claims, 6 Drawing Sheets

PLACEMENT BASED DESIGN CELLS INJECTION INTO AN INTEGRATED CIRCUIT DESIGN

BACKGROUND OF THE INVENTION

1. Field of the Invention

The present invention relates to the field of integrated circuits (IC). More specifically, the present invention relates to methods and apparatuses associated with processing an IC design.

2. Background Information

Because of the ever increasing complexity of IC designs, most modern IC designs are expressed in terms of hierarchically organized design cells. For example, an exemplary IC may be expressed in terms of a collection of placements of design cells A, B, C, . . . and various "interconnecting" geometric elements, whereas design cell A may in turn be likewise expressed as a collection of placements of design cells A1, A2, . . . , and various "interconnecting" geometric elements within cell A, design cell B expressed as a collection of placements of design cells B1, B2, . . . , and various "interconnecting" geometric elements within cell B, and so forth.

Additionally, prior to fabrication (especially those IC designs fabricated using sub-micron processes), various verification operations, including but not limited to design rule checks (such as spacing), RC analysis, and so forth, are performed to ensure the fabricated IC will function as designed. In order to verify a particular design cell, in view of the hierarchical nature of its organization, it is necessary to verify the context independent and context dependent portions of the design cell separately. The context dependent portion of the design cell is promoted upward recursively until it is a part of the context independent portion of a higher level design cell, a process known as "selective promotion".

In order to facilitate efficient performance of these operations, various design cell injection techniques are known and practiced in the art to reduce the amount of selective promotions. Design cell injection is a process by which a design cell is re-expressed in terms of a number of artificially-created design cells. For example, a design cell A having placements of design cells A1, A2, A3, A4 and A5 may be re-expressed in terms of placements of artificially created design cells A10 and A11, where artificially created design cell A10 is comprised of placements of design cells A1 and A2, and artificially created design cell A11 is comprised of placements of design cells A3, A4 and A5.

More specifically, Applicant is aware of three known design cell injection techniques. They are "homogenous" injection, "overlapping" injection and "heterogeneous" injection. As will be readily apparent from the description to follow, these three prior art techniques share a common characteristic in that they are "pattern based", i.e. each of the techniques is tailored for design cells having particular inter-cell relationship characteristics.

Figure 1:
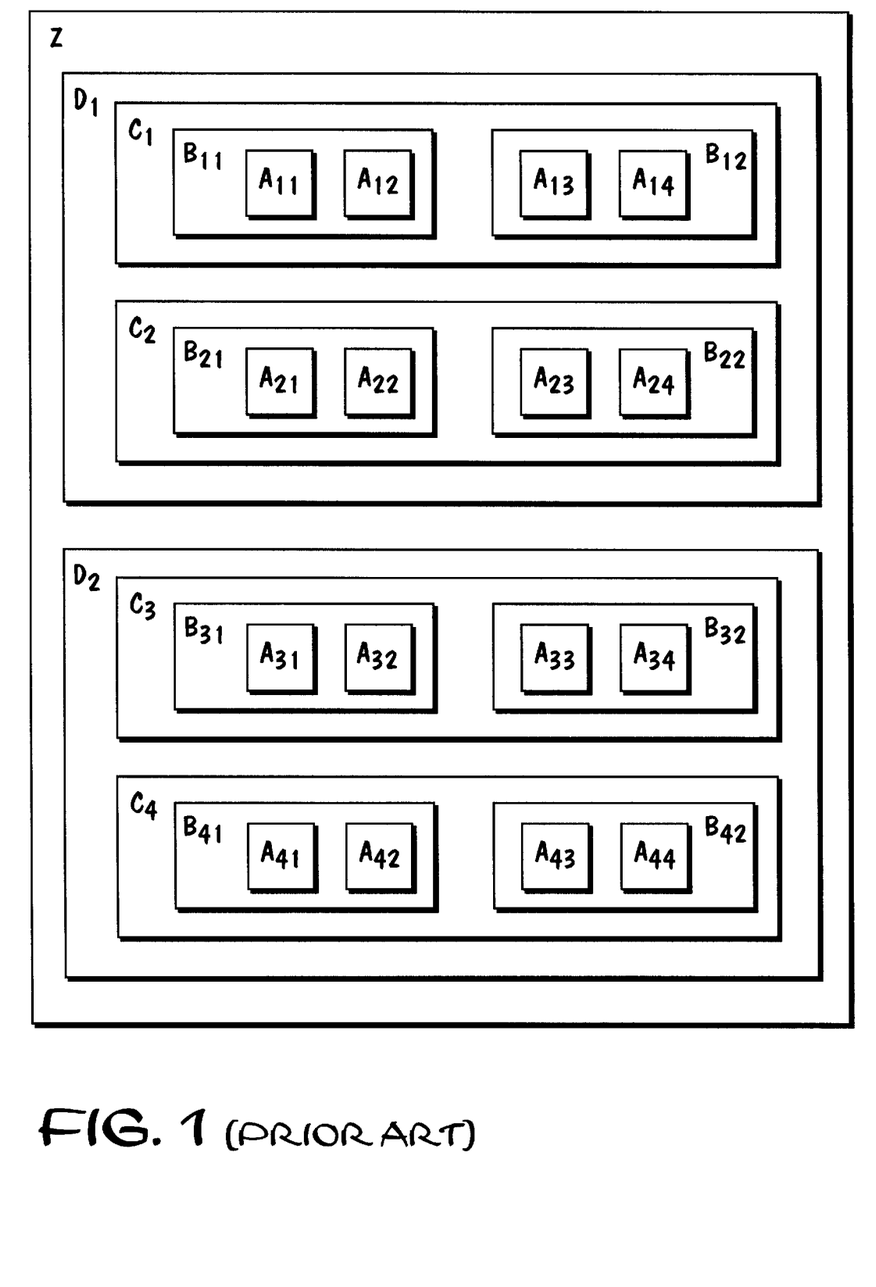
FIGS. 1–3 illustrate three known "pattern based" prior art techniques for design cells injection.

Under homogeneous injection, an exemplary design cell Z comprised of an array placement of identical design cell A, $A_{ij}$ (i.e. different instances of design cell A), where i and j both equal 1 through 4, will be re-expressed as shown in FIG. 1. That is, adjacent instances, e.g. $A_{11}$ and $A_{12}$, $A_{13}$ and $A_{14}$, will first be combined to form instances of design cell B, $B_{11}$ and $B_{12}$. Then, instances of design cell B, $B_{11}$ and $B_{12}$ etc. will be combined to form instances of design cell C, $C_1$, $C_2$ and so forth. Eventually, design cell Z is re-expressed in terms of instances of design cell D, $D_1$ and $D_2$, where design cell D is comprised of placements of design cell C. Design cell C in turn is comprised of instances of design cell B, $B_{11}$ and $B_{12}$, $B_{21}$ and $B_{22}$, $B_{31}$ and $B_{32}$ and $B_{41}$ and $B_{42}$ respectively. The technique, i.e. homogeneous injection, is commonly applied to IC such as a memory chip.

Figure 2:
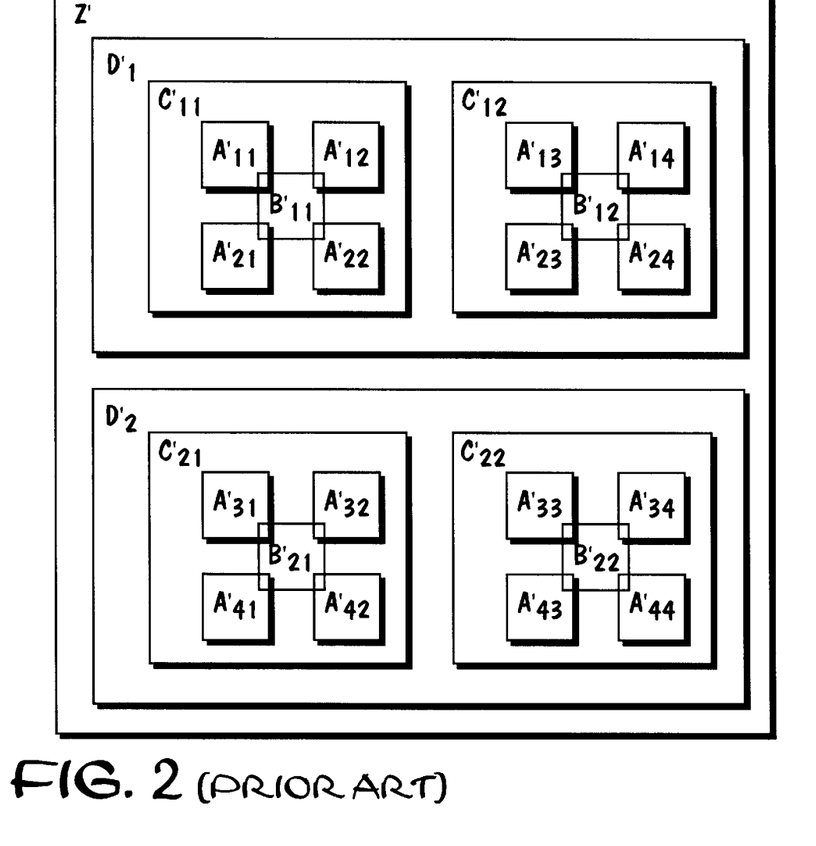

Under overlapping injection, an exemplary design cell Z' comprised of placements of design cell A', $A'_{ij}$ (i.e. different instances of design cell A'), where i and j both equal 1 through 4, and having "superimposed" placements of design cell B', $B'_{kl}$, where k and l both equal 1 through 2, will be re-expressed as shown in FIG. 2. That is, a group of design cell placements exhibiting a particular structural pattern, e.g. $A'_{11}$, $A'_{12}$, $A'_{21}$, $A'_{22}$ and $B'_{11}$, $A'_{13}$, $A'_{14}$, $A'_{23}$, $A'_{24}$ and $B'_{12}$, will first be combined to form instances of design cell C', $C'_{11}$ and $C'_{12}$. Then, design cell placements $C'_{11}$ and $C'_{12}$ etc. will be combined to form instances of design cell D', $D'_1$ and $D'_2$. So, design cell Z' is ultimately re-expressed in terms of instances of design cell D', $D'_1$ and $D'_2$. The technique, i.e. overlapping injection, is commonly applied to IC comprised of gate arrays.

Figure 3:
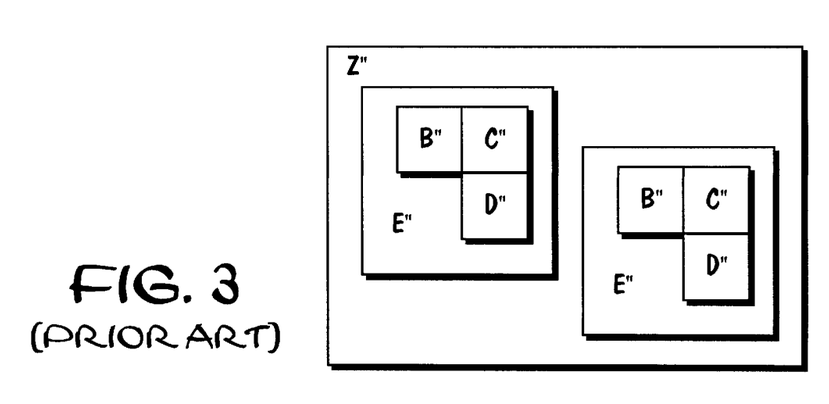

Under heterogeneous injection, an exemplary design cell Z" comprised of a number of "standard" cells will be re-expressed with new design cells replacing a group of standard cells having a distinct structural organization, as shown in FIG. 3. For example, exemplary design cell Z" having a number of placements of design cells B", C" and D", will be re-expressed in terms of multiple placements of design cell E", where design cell E" is comprised of placements of design cells B", C" and D". The technique, i.e. heterogeneous injection, is commonly applied to IC comprised of a large number of "standard" cells. [The term "standard" cell, as understood by those skilled in the art, refers to "building block" circuitry that are frequently reused in the design of an IC. They are often supplied by EDA tool vendors.]

While these techniques have worked well for IC designs having the above enumerated inter-cell relationship characteristics, experience has shown that their contributions to improving the efficiency for verifying IC designs with a large number of "flat" design cells are limited. Thus, additional approaches to further improve the efficiency for processing such IC designs are desired.

SUMMARY OF THE INVENTION

An EDA tool is provided with the ability to re-express a design cell of an IC design in terms of placements of a number of newly formed intervening constituent design cells, the IC design having a number of hierarchically organized placements of design cells. The new intervening constituent design cells are formed in accordance with a number of metrics profiling placements of the original constituent design cells of the design cell. The EDA tool is also provided with the ability to determine the metrics.

In one embodiment, the metrics are weights reflective of at least placement activities associated with row and column coordinates of the design cell. The EDA tool first determines these weights, and then uses the determined weights to select a subset of the row/column coordinates as cut line coordinates to logically partition the design cell into a number of regions. Finally, the EDA tool selectively groups contents of the selected design cell to form the new intervening design cells based on the contents' relations to the formed regions.

In one embodiment, the EDA tool is a design verification tool for use to verify the IC design prior to fabrication.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as row/column coordinates, cut lines, horizontal/vertical orientations, and so forth. As well understood by those skilled in the art, these terminology are merely logical in nature to facilitate explanation of the present invention. Parts of the description will also be presented in terms of operations performed by a computer system, using terms such as tables, data and the like. As well understood by those skilled in the art also, these quantities take the form of electrical, magnetic, or optical signals capable of being stored, transferred, combined, and otherwise manipulated through mechanical and electrical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily performed in the order they are presented, or order dependent. Lastly, repeated usage of the phrase "in one embodiment" does not necessarily refer to the same embodiment, although it may.

Figure 4:
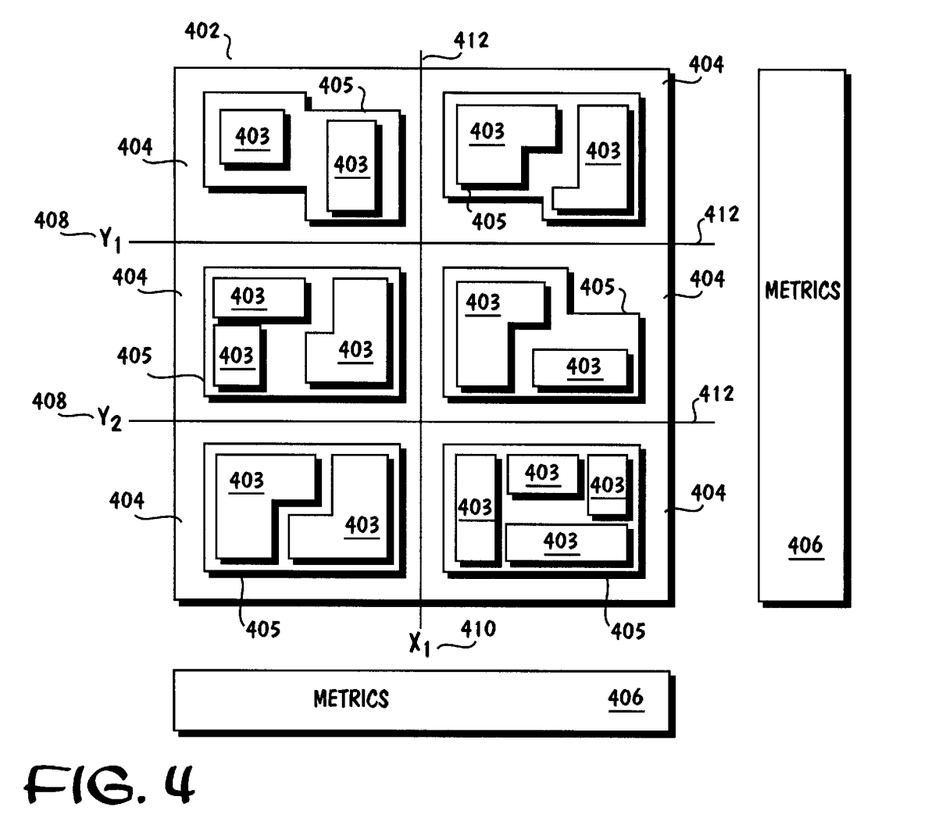
FIGS. 4–5 illustrate an overview of the "placement based" technique for design cells injection of the present invention in accordance with one embodiment.
Figure 5:
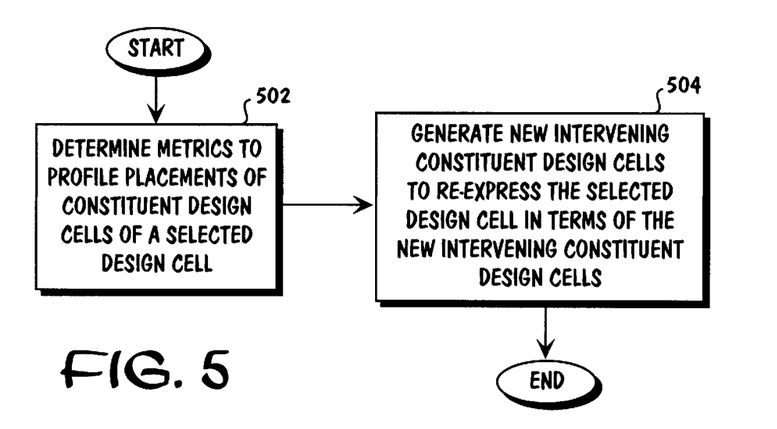

Referring now to FIGS. 4–5, wherein an overview of the "placement based" technique of the present invention is shown. As illustrated, in accordance with the present invention, design cell 402 of an integrated circuit design having a number of hierarchically organized design cells is re-expressed in terms of a number of new intervening constituent design cells 405 formed in accordance with a number of metrics 406 profiling placements of original constituent design cells 403 of design cell 402. Metrics 406 of design cell 402 are first determined (operation 502). Then, using metrics 406, contents of design cell 402 (i.e. placements and geometries) are selectively grouped to form new intervening constituent design cells 405 (operation 504), thereby allowing design cell 402 to be re-expressed in terms of the new intervening constituent design cells 405. Operations 502–504 are repeated as many times as necessary to all "applicable" design cells of the IC design. What constitutes an "applicable" design cell is application dependent. In one embodiment, the "applicable" design cells are the "flat" design cells of an IC design.

As will be described in more details below, in one embodiment, metrics 406 are weights reflective of at least placement activities at row/column coordinates, 25 e.g. 408–410, of design cell 402. Weight metrics 406 of row and column coordinates of design cell 402 are first determined (operation 502). Then, using weight metrics 406, a subset of row/column coordinates, e.g. 408–410, are selected as cut line coordinates 408–410 to logically partition design cell 402 into a number of regions 404 with cut lines 412 (operation 504). Finally, contents of design cell 402 are selectively grouped to form new intervening constituent design cells 405 based on the contents' relations with regions 404 (operation 504).

Note that for ease of understanding, each new intervening constituent design cell 405 is shown in the illustrated embodiment as being disposed within one of regions 404, however, as will be readily apparent from the description to follow, that is not necessarily the case. A resulting intervening constituent design cell 405 may straddle multiple regions 404, to be explained more fully below. Furthermore, cut lines 412 are shown in the illustrated embodiment as "running" across the entire width/height of design cell 402, however, in alternate embodiments, the present invention may be practiced with cut lines 412 starting and stopping at any arbitrary points, as well as "running" in an angle.

Figure 6:
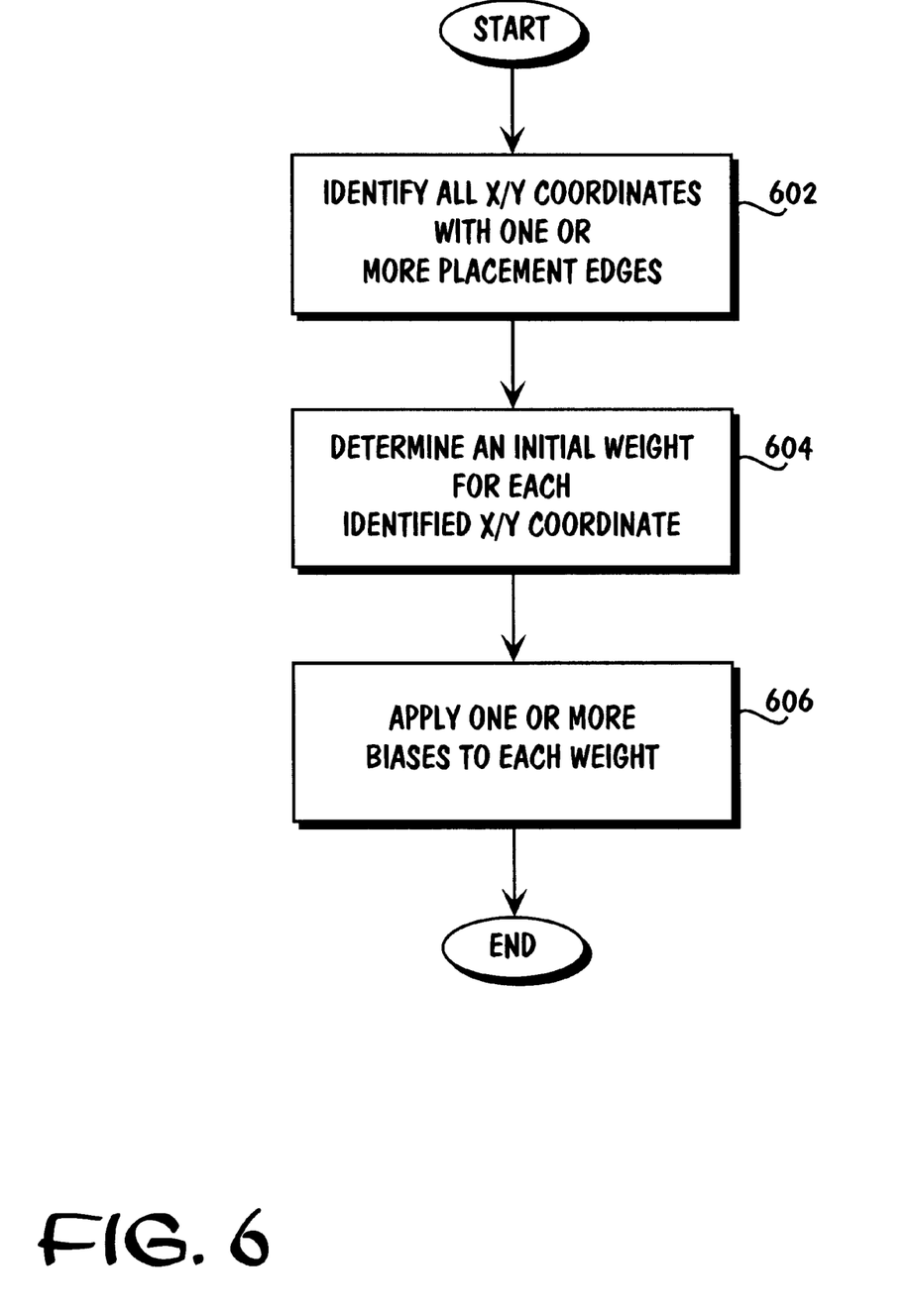
FIG. 6 illustrates determination of metrics to profile placements of constituent design cells of a selected design cell in accordance with one embodiment.

Referring now to FIG. 6 wherein determination of metrics to profile placements of constituent design cells of a selected design cell in accordance with one embodiment is shown. As illustrated, at 602, all row and column coordinates (also referred to as x and y coordinates) of the selected design cell with at least one placement activity are first identified. Then, at 604, an initial weight reflective of the placement activities is determined for each of the row/column coordinates. In one embodiment, the weight is set to equal the sum of twice the length of each placement edge along the particular row/column coordinate. Next, at 606, biases are applied to each of the initial weights. In one embodiment, the biases applied include a bias to disfavor cutting across a placement interior. In one embodiment, the bias is reflected by reducing the initially assigned weight by the sum of the lengths of all placement interiors crossing a potential cut line at the particular row/column coordinate. In one embodiment, the biases applied include a bias to facilitate substantially even distribution of the new intervening constituent design cells to be formed. In one embodiment, the bias is effectuated by proportionally adjusting each weight in view of its associated row/column coordinate's relative position in an interval, the size of which is calculated in accordance with a desired granularity level for forming the new intervening constituent design cells. More specifically, in one embodiment, the size is calculated in accordance with the formula $E/(2*F)$, where E is the length of the appropriate (i.e. x or y) axis of the design cell and F is a granularity factor targeting the formation of $F \times 1$ or $1 \times F$ to $F \times F$ new intervening constituent design cells. For example, F may be 256 targeting the formation of 256×1 or 1×256 to 256×256 new intervening constituent design cells, or F may be 512 targeting the formation of 512×1 or 1×512 to 512×512 new intervening constituent design cells. Other granularity factors may also be used. In this embodiment, F is selected before the even distribution biasing operation is performed. In other embodiment, both biasing operations as well as other biasing operations may also be performed.

Figure 7:
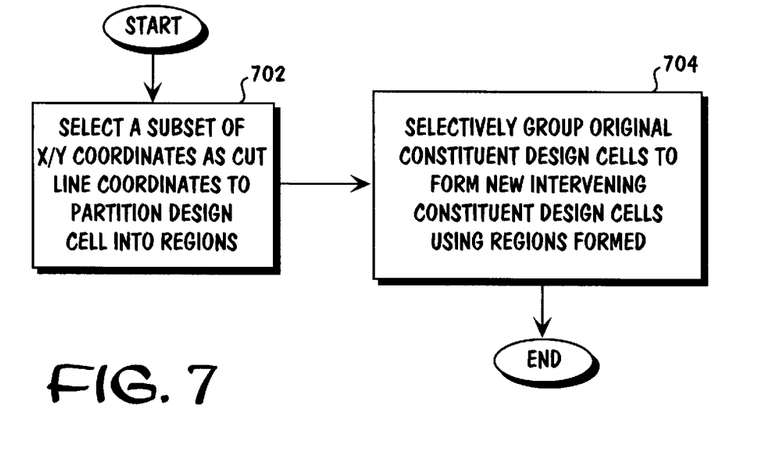
FIGS. 7–8 illustrate generation of new intervening constituent design cells using the determined metrics in accordance with one embodiment.

FIG. 7 illustrates a manner in which new intervening constituent design cells may be formed for a selected design cell using the above described coordinates associated weight metrics in accordance with one embodiment. As illustrated, at 702, a subset of the row and column coordinates are selected as cut line coordinates in accordance with at least their associated weight metrics as cut line coordinates to logically partition the selected design cell into a number of regions with cut lines logically placed at the selected row/column coordinates. Then at 704, contents of the selected design cell are selectively grouped to form the new intervening constituent design cells in accordance with the contents' relations with the formed regions. More specifically, in one embodiment, in general, one new intervening constituent design cell is formed for each region. Contents (i.e. placements and geometry) of the selected design cell disposed in a region becomes contents of a new intervening constituent design cell corresponding to the region. An original constituent design cell is "distributed" to the new intervening constituent design cell corresponding to the region to which the original constituent design cell has the most "area" affinity.

Figure 8:
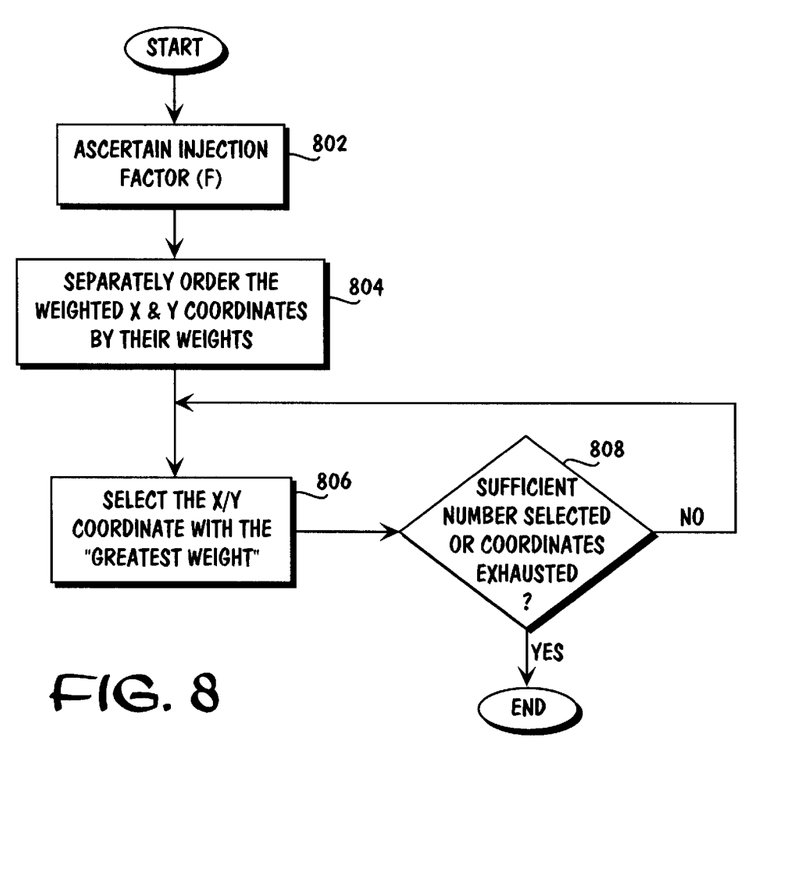

FIG. 8 illustrates a manner in which the cut line coordinates are selected in accordance with one embodiment. As illustrated, at 802, the above described granularity factor (F) is "ascertained". At 804, the row and column coordinates are separately ordered by their weights in descending order, i.e. with the coordinates having the greatest weight being placed at the "front" of the lists, or at the "top" of the queues, depending on the types of data structures employed. Next, at 806, the "top" row and column coordinates with the greatest weight are compared, and the coordinate with the "greater" weight is selected as a cut line coordinate. However, in one embodiment, a bias is further applied in the selection process. A column coordinate is favored over a row coordinate. A row coordinate is deemed to be having a greater weight than the column coordinate merely when the row coordinate's corresponding weight is at least twice that of the column coordinate's corresponding weight. The operation at 806 is repeated until either all row/column coordinates have been "exhausted" or "sufficient" number of cut line coordinates have been selected to achieve the desired granularity. In one embodiment, "sufficiency" is assumed when either the total number of cut line coordinates selected exceeds 2×F or the number of row coordinates selected times the number column coordinates selected exceeds F×F.

Figure 9:
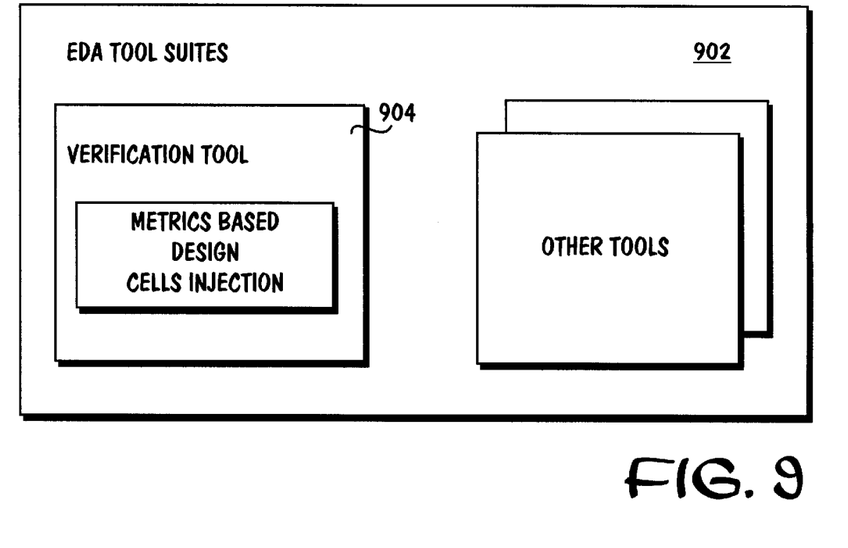
FIG. 9 illustrates an EDA tool suite incorporated with the teachings of the present invention in accordance with one embodiment.

Referring now to FIG. 9, wherein an EDA tool suite incorporated with the teaching of the present invention is shown. As illustrated, EDA tool 900 includes a number of tools, in particular, verification tool 902. For the illustrated embodiment, verification tool 902 is incorporated with the teachings of the present invention, i.e. it is provided with the ability to determine a number of metrics to profile placements of the constituent design cells of a design cell, and the ability to selectively group the original constituent design cells to form new intervening constituent design cells, using the determined metrics, to re-express the design cell in terms of the new intervening constituent design cells.

Figure 10:
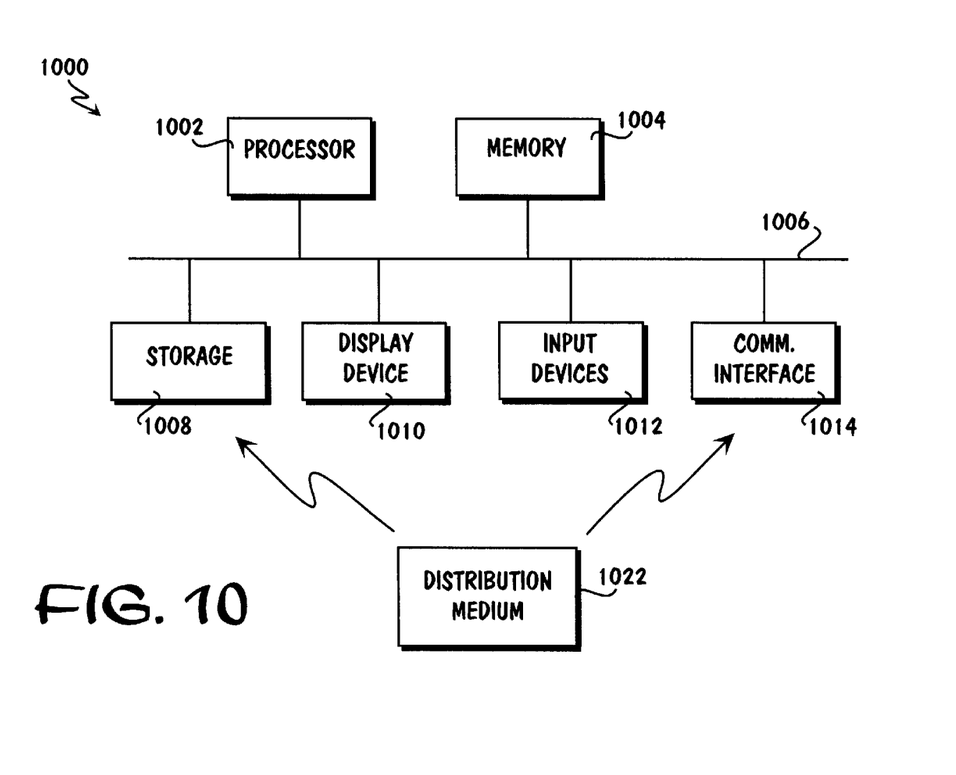
FIG. 10 illustrates a computer system suitable for practicing the present invention.

FIG. 10 illustrates one embodiment of a computer system suitable for use to practice the present invention. As shown, computer system 1000 includes processor 1002 and system memory 1004 coupled to each other via system bus 1006. Coupled also to system bus 1006 are non-volatile storage 1008, display device 1010, input/output devices 1012, and communication interface 1014. Each of these elements perform its conventional functions known in the art. In particular, system memory 1004 and non-volatile storage 1008 are employed to store a working copy and a permanent copy of the programming instructions implementing the above described teachings of the present invention. System memory 1004 and non-volatile storage 1008 may also be employed to store the IC design. The permanent copy of the programming instructions to practice the present invention may be loaded into non-volatile storage 1008 in the factory, or in the field, through distribution medium 1022 or through communication interface 1014. Any one of a number of recordable medium, such as tapes, CDROM, DVD, and so forth may be employed to store the programming instructions for distribution. In one embodiment, the programming instructions are part of a collection of programming instructions implementing EDA tool 902 of FIG. 9. The constitution of elements 1002–1022 are well known, and accordingly will not be further described. In alternate embodiments, other elements in lieu of or in addition to the elements of the illustrated embodiment, such as additional processors, may be employed.

Thus, a method and apparatus for placement based design cells injection into an IC design has been described. While the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. A computer implemented method comprising:
   determining a plurality of metrics for a selected one of a plurality of hierarchically organized design cells of an integrated circuit design to profile placements of the selected design cell's constituent design cells; and
   selectively grouping contents of the design cell, using said determined metrics, to form new intervening constituent design cells to re-express the selected design cell in terms of the new intervening constituent design cells, wherein said determination of metrics to profile placements of the selected design cell's constituent design cells comprises identifying a plurality of coordinates of the selected design cell, and determining correspondingly associated weights for the identified coordinates, further wherein said identification of coordinates comprises identifying a plurality of row/column coordinates, each row/column coordinate having at least one edge placed along or crossing the row/column coordinate, and said determination of correspondingly associated weights comprises assigning a weight to each identified row/column coordinate that is reflective of placement activities at the row/column coordinate.

2. The computer implemented method of claim 1, wherein said assignment of weight to each identified row/column coordinate comprises assigning a weight that is proportionally reflective of placement edges along the row/column coordinate.

3. The computer implemented method of claim 2, wherein said assignment of weight to each identified row/column coordinate further comprises biasing said assigned weight in a negative way to proportionally reflect whether one or more placement interiors cross a potential cut line at the row/column coordinate.

4. The computer implemented method of claim 1, wherein said assignment of weight to each identified row/column coordinate further comprises adjusting the assigned weight to facilitate even distribution of the new intervening constituent design cells to be formed.

5. The computer implemented method of claim 4, wherein said adjustment comprises proportionally adjusting the weight associated with a row/column coordinate in accordance with the row/column coordinate's relative position within an interval, the size of which being determined in accordance with a targeted granularity of the intervening constituent design cells to be formed.

6. The computer implemented method of claim 1, wherein said selective grouping using the determined metrics comprises selecting a subset of the identified row/column coordinates in accordance with their associated weights as cut line coordinates to logically partition the selected one of the hierarchically organized design cells into a plurality of regions, and then grouping contents :of the selected design cell in view of the contents' relations to the regions formed.

7. The computer implemented method of claim 6, wherein said selection of a subset of the identified row/column coordinates comprises selecting a number of the identified row/column coordinates in accordance with their associated weights and in view of a targeted granularity of the intervening constituent design cells to be formed.

8. The computer implemented method of claim 6, wherein said selection of a subset of the identified row/column coordinates is biased favoring a column coordinate over a row coordinate.

9. A computer implemented method comprising:
determining a plurality of metrics for a selected one of a plurality of hierarchically organized design cells of an integrated circuit design to profile placements of the selected design cell's constituent design cells; and
selectively grouping contents of the design cell, using said determined metrics, to form new intervening constituent design cells to re-express the selected design cell in terms of the new intervening constituent design cells, wherein said determination of metrics and said formation of new intervening constituent design cells using the determined metrics are performed as an integral part of a process for verifying the IC design.

10. An article of manufacture comprising:
a recordable medium having recorded thereon a plurality of programming instructions suitable for use to program an apparatus to enable the programmed apparatus to be able to determine a plurality of metrics for a selected one of a plurality of hierarchically organized design cells of an integrated circuit design to profile placements of the selected design cell's constituent design cells, and to selectively group contents of said design cell, using said determined metrics, to form new intervening constituent design cells to re-express the selected design cell in terms of the new intervening constituent design cells, wherein the programming instructions enable the programmed apparatus to determine the metrics to profile placements of the selected design cell's constituent design cells by identifying a plurality of coordinates of the selected design cell, and determining correspondingly associated weights for the identified coordinates, further wherein the programming instructions enable the programmed apparatus to identify the coordinates by identifying a plurality of row/column coordinates, each row/column coordinate having at least one edge placed along or crossing the row/column coordinate, and enable the programmed apparatus to determine the correspondingly associated weights by assigning a weight to each identified row/column coordinate that is reflective of placement activities at the row/column coordinate.

11. The article of manufacture of claim 10, wherein the programming instructions enable the programmed apparatus to assign the weight to each identified row/column coordinate by assigning a weight that is proportionally reflective of placement edges along the row/column coordinate.

12. The article of manufacture of claim 11, wherein the programming instructions further enable the programmed apparatus to include in said assignment of weight to each identified row/column coordinate a biasing operation biasing the assigned weight in a negative way to proportionally reflect whether one or more placement interiors cross a potential cut line at the row/column coordinate.

13. The article of manufacture of claim 10, wherein the programming instructions further enable the programmed apparatus to include in said assignment of weight to each identified row/column coordinate an adjustment operation adjusting the assigned weight to facilitate even distribution of the new intervening constituent design cells to be formed.

14. The article of manufacture of claim 13, wherein the programming instructions further enable the programmed apparatus to make said adjustment to facilitate even distribution by proportionally adjusting the weight associated with a row/column coordinate in accordance with the row/column coordinate's relative position within an interval, the size of which being determined in accordance with a targeted granularity of the intervening constituent design cells to be formed.

15. The article of manufacture of claim 10, wherein the programming instructions further enable the programmed apparatus to make said selective grouping using the determined metrics by selecting a subset of the identified row/column coordinates in accordance with their associated weights as cut line coordinates to logically partition the selected design cell into a plurality of regions, and then grouping contents of the selected design cell in view of their relations to the regions formed.

16. The article of manufacture of claim 15, wherein the programming instructions further enable the programmed apparatus to make said selection of a subset of the identified row/column coordinates further in view of a targeted granularity of the intervening constituent design cells to be formed.

17. The article of manufacture of claim 15, wherein the programming instructions further enable the programmed apparatus to make said selection of a subset of the identified row/column coordinates in a biased manner favoring a column coordinate over a row coordinate.

18. An article of manufacture comprising:
a recordable medium having recorded thereon a plurality of programming instructions suitable for use to program an apparatus to enable the programmed apparatus to be able to determine a plurality of metrics for a selected one of a plurality of hierarchically organized design cells of an integrated circuit design to profile placements of the selected design cell's constituent design cells, and to selectively group contents of said design cell, using said determined metrics, to form new intervening constituent design cells to re-express the selected design cell in terms of the new intervening constituent design cells, wherein said determination of metrics and said formation of new intervening constituent design cells using the determined metrics are performed as an integral part of a process for verifying the IC design, further wherein the programming instructions are member programming instructions of an EDA tool.

19. A computer system comprising:

one or more storage devices having stored therein a plurality of programming instructions, and for use to receive and store an integrated circuit design having a plurality of hierarchically organized design cells; and one or more processors coupled to the one or more storage devices to execute the programming instructions to determine a plurality of metrics for a selected one of the plurality of hierarchically organized design cells of the integrated circuit design to profile placements of the selected design cell's constituent design cells, and to selectively group contents of the selected design cell, using said determined metrics, to form new intervening constituent design cells to re-express the selected design cell in terms of the new intervening constituent design cells, wherein the one or more processors execute the programming instructions to identify a plurality of coordinates of the selected design cell, and determine correspondingly associated weights for the identified coordinates, to make said metrics determination for profiling placements of the selected design cell's constituent design cells, further wherein the one or more processors execute the programming instructions to identify a plurality of row/column coordinates, each row/column coordinate having at least one edge placed along or crossing the row/column coordinate, and to determine the correspondingly associated weights by assigning a weight to each identified row/column coordinate that is reflective of placement activities at the row/column coordinate, to make said coordinate identification.

20. The computer system of claim 19, wherein the one or more processors execute the programming instructions to assign a weight that is proportionally reflective of placement edges along the row/column coordinate, to make said weight assignment to each identified row/column coordinate.

21. The computer system of claim 20, wherein the one or more processors further execute the programming instructions to bias the assigned weight in a negative way to proportionally reflect whether one or more placement interiors cross a potential cut line at the row/column coordinate, while making said assignment of weight to each identified row/column coordinate.

22. The computer system of claim 19, wherein the one or more processors further execute the programming instructions to adjust the assigned weight to facilitate even distribution of the new intervening constituent design cells to be formed, while making said weight assignment to each identified row/column coordinate.

23. The computer system of claim 22, wherein the one or more processors further execute the programming instructions to proportionally adjust the weight associated with a row/column coordinate in accordance with the row/column coordinate's relative position within an interval, the size of which being determined in accordance with a targeted granularity of the intervening constituent design cells to be formed, while making said adjustment to facilitate even distribution of the intervening constituent design cells to be formed.

24. The computer system of claim 19, wherein the one or more processors further execute the programming instructions to select a subset of the identified row/column coordinates in accordance with their associated weights as cut line coordinates to logically partition the selected design cell into a plurality of regions, and then to group contents of the selected design cell in view of the contents' relations to the regions formed, to make said selective grouping using the determined metrics.

25. The computer system of claim 24, wherein the one or more processors execute the programming instructions to make said selection of a subset of the identified row/column coordinates further in view of a targeted granularity of the intervening constituent design cells to be formed.

26. The computer system of claim 24, wherein the one or more processors execute the programming instructions to make said selection of a subset of the identified row/column coordinates in a biased manner favoring a column coordinate over a row coordinate.

* * * * *